US010428918B2

(12) United States Patent
Krauer

(10) Patent No.: US 10,428,918 B2
(45) Date of Patent: Oct. 1, 2019

(54) POSITIONING DEVICE

(71) Applicant: Schneeberger Holding AG, Roggwil (CH)

(72) Inventor: Patrick Krauer, Ruswil (CH)

(73) Assignee: SCHNEEBERGER HOLDING AG, Roggwil (CH)

( * ) Notice: Subject to any disclaimer, the term of this patent is extended or adjusted under 35 U.S.C. 154(b) by 488 days.

(21) Appl. No.: 15/174,456

(22) Filed: Jun. 6, 2016

(65) Prior Publication Data
US 2016/0363200 A1 Dec. 15, 2016

(30) Foreign Application Priority Data

Jun. 11, 2015 (EP) .................................... 15405038

(51) Int. Cl.
*F16H 25/18* (2006.01)
*B23Q 1/44* (2006.01)
(Continued)

(52) U.S. Cl.
CPC .............. *F16H 25/186* (2013.01); *B23Q 1/44* (2013.01); *B23Q 1/60* (2013.01); *B25J 9/109* (2013.01); *F16H 25/14* (2013.01); *H01L 21/68* (2013.01)

(58) Field of Classification Search
CPC .......... F16D 1/076; F16H 55/12; F16H 25/14; B23Q 1/44; B23Q 1/60; B23Q 1/56; H01L 21/68; Y10T 74/20348
(Continued)

(56) References Cited

U.S. PATENT DOCUMENTS 4,232,772 A * 11/1980 Brissey ................. F16D 27/118
192/101
6,082,515 A * 7/2000 Oono ....................... F16D 1/076
192/108
(Continued)

FOREIGN PATENT DOCUMENTS

DE 3725188 A1 2/1989
EP 1911551 A1 4/2008
(Continued)

*Primary Examiner* — William Kelleher
*Assistant Examiner* — Gregory T Prather
(74) *Attorney, Agent, or Firm* — Cowen, Liebowitz & Latman, P.C.

(57) ABSTRACT

A positioning device, comprising a base element, a carrier element to be positioned relative to the base element along a z-axis as well as at least one first and one second slide element, wherein the first or second slide element on the one hand is disposed displaceably by means of a first or second base guide device along a first or second base line on the base element and on the other hand by means of a first or second ascent guide device along a first or second ascent line on the carrier element, wherein the first or second ascent line and the first or second base line run in a projection along the z-axis parallel to one another and with respectively constant different angles of inclination relative to the z-axis, and wherein the first and the second ascent guide device are arranged with respect to one another in such a manner that in at least one projection perpendicular to the z-axis, the first and the second ascent line are inclined opposite to one another relative to the z-axis. It is provided that for the synchronous displacement of the first and second slide element the positioning device comprises at least one drive device which comprises a rotary drive having an axis of rotation parallel to the z-axis and a coupling element, wherein the coupling element couples the rotary drive to the first and/or second slide element in such a manner that a (Continued)

rotational movement of the rotary drive causes a synchronous displacement of the first and second displacement element along the respective base lines.

31 Claims, 5 Drawing Sheets

(51) Int. Cl.
*B23Q 1/60* (2006.01)
*B25J 9/10* (2006.01)
*F16H 25/14* (2006.01)
*H01L 21/68* (2006.01)

(58) Field of Classification Search
USPC .................................................. 74/490.08
See application file for complete search history.

(56) References Cited

U.S. PATENT DOCUMENTS

| | | | | |
|---|---|---|---|---|
| 8,141,452 B2* | 3/2012 | Wood | ................ | B23Q 1/5406 248/179.1 |
| 2007/0060396 A1* | 3/2007 | Bachle | ................ | F16D 1/076 464/89 |
| 2007/0119347 A1* | 5/2007 | Yamazaki | ................ | B23Q 1/60 108/20 |
| 2008/0229860 A1* | 9/2008 | Bonev | ................ | B25J 9/106 74/479.01 |
| 2009/0044644 A1* | 2/2009 | Hsieh | ................ | F16H 25/14 74/55 |
| 2009/0056158 A1* | 3/2009 | Tada | ................ | G02B 7/005 33/645 |
| 2013/0048927 A1* | 2/2013 | Epshetsky | ................ | B25H 1/0021 254/98 |
| 2013/0278099 A1* | 10/2013 | Komatsu | ................ | H02K 7/14 310/80 |
| 2013/0336737 A1* | 12/2013 | Fujita | ................ | B23B 41/00 408/87 |
| 2014/0083221 A1* | 3/2014 | Hein | ................ | F16H 55/12 74/421 A |
| 2015/0122066 A1* | 5/2015 | McCombs | ................ | B21D 22/14 74/433.5 |
| 2016/0363200 A1* | 12/2016 | Krauer | ................ | B25J 9/109 |
| 2016/0365219 A1* | 12/2016 | Nishioka | ................ | H01J 37/20 |
| 2019/0139809 A1* | 5/2019 | Hong | ................ | H01L 21/68742 |

FOREIGN PATENT DOCUMENTS

| | | |
|---|---|---|
| JP | 61-075935 U1 | 5/1986 |
| JP | 2000153994 A | 6/2000 |

* cited by examiner

POSITIONING DEVICE

REFERENCE TO RELATED APPLICATION

This application claims priority to European Patent Application No. 15405038.9, filed Jun. 11, 2015. The entire disclosure of European Patent Application No. 15405038.9 is incorporated herein by reference.

BACKGROUND OF THE INVENTION

1. Field of the Invention

The invention relates to a positioning device, which comprises a base element and a carrier element, which can be positioned along a z-axis relative to the base element by displacing at least two slide elements transversely to the z-axis.

2. Description of the Related Art

Such a positioning device is known, for example, from U.S. Pat. No. 5,731,631. The device described there comprises a base and a carrier element having a working surface and two parallel-running wedge surfaces opposite the working surface. The carrier element is connected to the base by means of two spaced-apart vertical linear guides, which restrict the movement of the carrier element relative to the base to a displacement along the vertical z-axis. The positioning device further comprises as slide element two parallel-running wedges connected rigidly to one another, which are disposed between respectively one of the wedge surfaces of the carrier element and the base and which are connected to the base by means of two spaced-apart linear guides. By means of the two linear guides, the wedges can be moved along an x-axis perpendicular to the z-axis. In addition, the upper sides of the wedges are each connected displaceably to the wedge surface of the carrier element by means of a further linear guide. A linear motor is used to move the wedges along the x-axis whereby the carrier element is moved along the z-axis relative to the base. In this case, the two vertical linear guides between the base and the carrier element prevent the carrier element from co-moving additionally along the x-axis relative to the base during the movement along the z-axis.

For many applications in the area of high-precision positioning however, the system stiffness of such positioning devices with vertical linear guides is frequently not sufficient. In particular, a vertical linear guide does not ensure a sufficiently high rotational stiffness about the vertical axis. In addition, a design with displacement wedges and additional vertical linear guides is technically very complex and economically very expensive.

Furthermore, a positioning device with two parallel linear translation actuators is known from EP 1 911 551 A1, which are coupled to a carrier element to be positioned via two respective parallel oriented inclined thrust surfaces. Both thrust surfaces are inclined opposite to one another such that a synchronous displacement of both actuator axes causes a lifting or lowering of the carrier element. Both inclined thrust surfaces are formed by two respectively inclined linear guide rails disposed on opposite sides of the carrier element. However, using two parallel linear translation actuators is technically very complex and economically very expensive and requires a synchronization of both drives.

OBJECT AND SUMMARY OF THE INVENTION

It is therefore an object of the present invention to simplify technically the positioning devices with slide elements known from the prior.

This object is solved by a positioning device according to claim 1. Advantageous embodiments of the invention are the subject matter of the dependent claims.

The positioning device according to the preamble of claim 1—as for example it is known from EP 1 911 551 A1—comprises a base element, a carrier element to be positioned relative to the base element along a z-axis as well as at least one first and one second slide element, wherein the first or second slide element on the one hand is disposed displaceably by means of a first or second base guide device along a first or second base line on the base element and on the other hand by means of a first or second ascent guide device along a first or second ascent line on the carrier element. In this case, the first or second ascent line and the first or second base line run in a projection along the z-axis parallel to one another and with respectively constant different angles of inclination relative to the z-axis. The ascent lines or base lines correspond in this case to the guide paths or displacement paths of the respective ascent or base guide devices.

Furthermore, it is provided that the first and the second ascent guide device are arranged with respect to one another in such a manner that in at least one projection perpendicular to the z-axis, the first and the second ascent lines are inclined opposite to one another relative to the z-axis.

Such an opposite arrangement of the first and second ascent guide device has the effect that due to a synchronous displacement of the first and the second slide element relative to the base element along the base guide devices, the carrier element is displaced relative to the base element exclusively along the z-axis and it is thereby prevented that the carrier element co-moves transversely to the z-axis. This is because, as a result of their opposite inclinations, the first and the second ascent guide device each mutually block a transverse movement of the carrier element along the first or second base guide direction or base line. Thus, an additional vertical guide which restricts the movement of the carrier element on the z-axis can be dispensed with. Furthermore, the opposite arrangement additionally ensures a system stiffness sufficient for already many high-precision applications.

"Synchronous displacement of the slide elements" in the sense of this invention means that the respective displacement movements of the first and second slide element along the first or second base line depending on the inclinations of the first or second ascent line with respect to the z-axis are matched to one another in such a manner that during the synchronous displacement along the first or second base line, the first and the second slide element displace the carrier element along the z-axis by the same amount.

For the synchronous displacement of the first and second slide element, according to the invention, the positioning device comprises at least one drive device, in particular a common drive device for all the slide elements, wherein the at least one drive device comprises a rotary drive having an axis of rotation parallel to the z-axis and a coupling element, wherein the coupling element couples the rotary drive to the first, and/or second slide element in such a manner that a rotational movement of the rotary drive brings about a synchronous displacement of the first and second slide element along the respective base lines.

For this purpose, it can be provided that the coupling element comprises a rotating body connected rigidly to the axis of rotation and at least one coupling member which is rotatably mounted relative to the axis of rotation with one end on one of the slide elements and the other end radially spaced apart from the axis of rotation on the rotating body.

Any types of drives are feasible as drive device, for example, linear actuators or rotary actuators, piezo-actuators, spindle drives, linear motors, step motors, servomotors or the like.

According to a particularly preferred embodiment of the invention, it is provided that the coupling element couples the rotary drive to the third and/or fourth slide element in such a manner that a rotational movement of the rotary drive brings about a synchronous displacement of the first, second, third and fourth slide element along the respective base lines.

In order to increase the system stiffness, in particular the rotational stiffness of the positioning device still further, according to an advantageous embodiment of the invention it can be provided that the positioning device further comprises a third and a fourth slide element. In this case, the third or fourth slide element is disposed displaceably on the one hand by means of a third or fourth base guide device along a third or fourth base line on the base element and on the other hand by means of a third or fourth ascent guide device along a third or fourth ascent line on the carrier element. The third or fourth ascent line and the third or fourth base line run parallel to one another in a projection along the z-axis and with respectively constant, different angles of inclination relative to the z-axis. In addition, the third and fourth ascent guide device are disposed with respect to one another in such a manner that in at least one projection perpendicular to the z-axis, the third and the fourth ascent line are inclined opposite to one another relative to the z-axis so that a synchronous displacement of the first, second, third and fourth slide element relative to the base element brings about a displacement of the carrier element relative to the base element exclusively along the z-axis.

Instead of two or four slide elements, in principle different numbers of such slide elements with a mutual blocking effect which restrict a movement of the carrier element to a displacement along the z-axis are also feasible. Thus, for example, three, five or more slide elements can be arranged in a polygonal configuration, distributed uniformly about the z-axis. Preferably however pairs of slide elements with a mutual blocking effect are present in each case, which are arranged with respect to one another so that in at least one projection perpendicular to the z-axis, both ascent lines of the respective part are inclined oppositely to one another relative to the z-axis.

According to a further advantageous embodiment of the invention, the first and/or second base line or the first, second, third and/or fourth base line run in a plane perpendicular to the z-axis. It can further be provided that the first and second base line or the first, second, third and fourth base line are distributed uniformly about the z-axis. Alternatively or additionally, the first and second base line or the first, second, third and fourth base line are configured axis-symmetrically relative to the z-axis. It is further feasible that the first and second ascent line or the first, second, third and fourth ascent line are configured axis-symmetrically relative to the z-axis. As a result of these measures, in particular the technical complexity of the structure of the positioning device is simplified. In addition, the synchronisation of the displacement movements of the slide element along the base lines is simplified.

The base guide devices or the base lines can fundamentally have any arbitrary shape, where they are not curved along the z-axis but have a constant angle of inclination with respect to the Z-axis greater than 0° and less than 180°. The same applies for the ascent guide devices or the ascent lines, where the angle of inclination of the ascent guide devices or ascent lines differs from the angle of inclination of the respectively corresponding base guide devices or base lines. For example, base guide devices which are arranged in a plane perpendicular to the z-axis and have a curved profile in the plane are feasible. Particularly preferably however the base and/or ascent guide devices are configured as linear guides. Thus it is provided according to an advantageous embodiment of the invention that the first and second base line are straight lines, in particular run parallel to one another along an x-axis perpendicular to the z-axis. In one embodiment with a total of four slide elements, it can further be provided that the third and fourth base line are straight lines, in particular run parallel to one another along a y-axis perpendicular to the x and z-axis.

If the base lines are straight lines, i.e. the base guide devices are configured as linear guides, it is expediently the case that in such an embodiment, the respectively corresponding ascent lines are also straight lines or the respectively corresponding ascent guide devices are configured as linear guides since, according to the invention, the ascent lines run in a projection along the z-axis parallel to the respectively corresponding base lines.

According to a further advantageous embodiment of the invention, it is provided that the first, second, third and/or fourth base line comprises a ball bearing, crossed roller bearing, rolling bearing or dovetail guide. Additionally or alternatively it can be provided that the first, second, third and/or fourth ascent guide device comprises a ball bearing, crossed roller bearing, rolling bearing or dovetail guide.

In order to implement the different angles of inclination of the respectively corresponding base and ascent line, it can be provided according to a further advantageous embodiment of the invention that the first, second, third and/or fourth slide element each comprises a wedge body on which preferably the corresponding base guide devices and ascent guide devices are arranged on opposite diverging sides of the wedge body where the aperture angle of the wedge corresponds to the difference angle between the angle of inclination of the base line and the angle of inclination of the corresponding ascent line relative to the z-axis.

Similarly it can be provided that the carrier element comprises a first, second, third and/or fourth wedge body on which respectively the first, second, third or fourth ascent guide device is disposed. It is also feasible that the carrier element has a first, second, third and/or fourth sloping surface on which respectively the first, second, third or fourth ascent guide device is arranged.

The translation between the displacement movement of the slide element along the base line and the resulting displacement movement of the carrier element along the z-axis can be adjusted by means of the choice of the angle of inclination of the respective ascent line and corresponding base line. In a particularly preferred embodiment, the first, second, third and fourth ascent line each enclose an angle between 45° and 85°, in particular between 60° and 80°, preferably between 71° and 79°, with respect to the z-axis.

In a further preferred embodiment of the invention, the base element comprises a plate, in particular a frame-like plate with a through opening. Similarly, it can be provided that the carrier element comprises a frame, in particular a rectangular, preferably square frame. This design results in a particularly rigid positioning device with a high system stiffness.

In the sense of a very compact design of the positioning device, it can further be provided that the first and the second ascent guide device are disposed on opposite sides of the carrier element and/or that the third and the fourth ascent guide device are disposed on opposite sides of the carrier element.

Further objects, aims, advantages and possible applications of the present invention are obtained from the following description of an exemplary embodiment of the invention depicted in the drawings.

DETAILED DESCRIPTION OF THE PRESENT INVENTION

Figure 1:
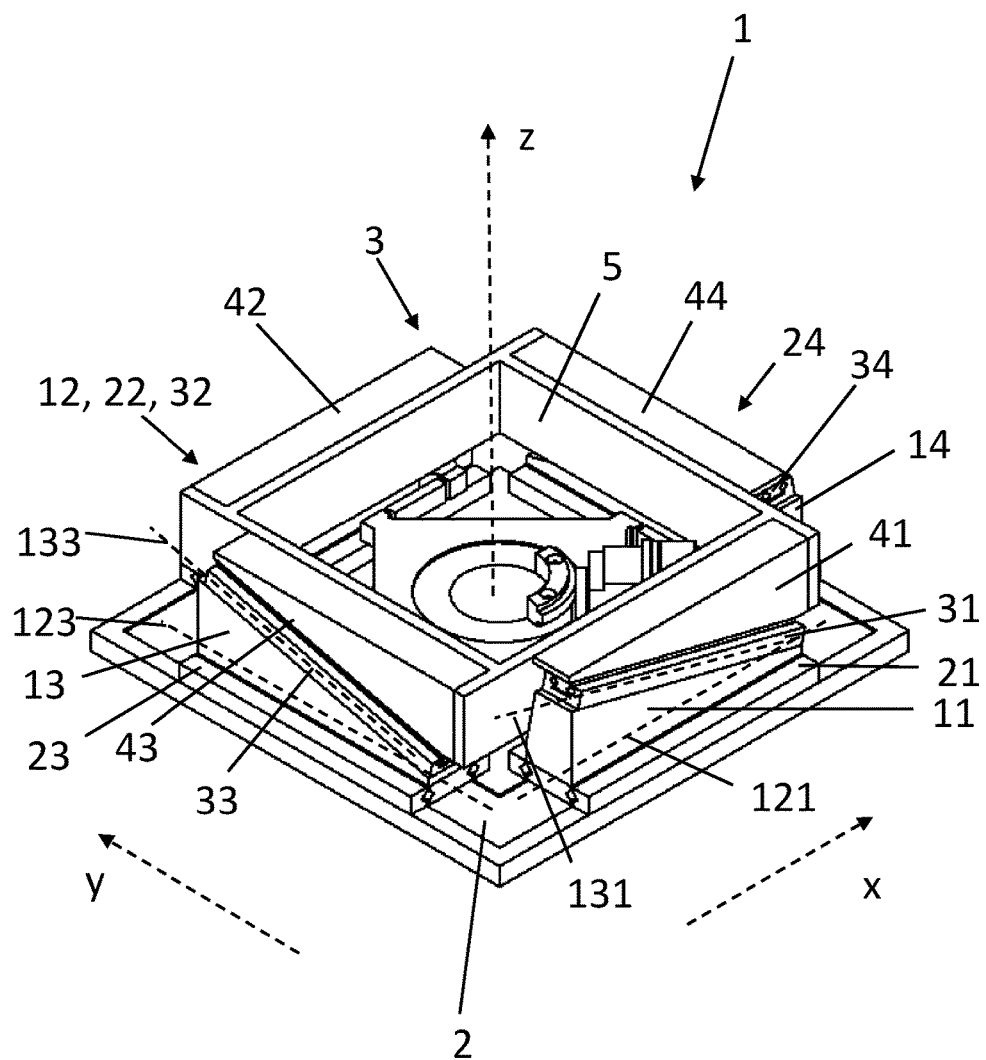
FIG. 1 shows a perspective view of a possible exemplary embodiment of a positioning device according to the invention.
Figure 2:
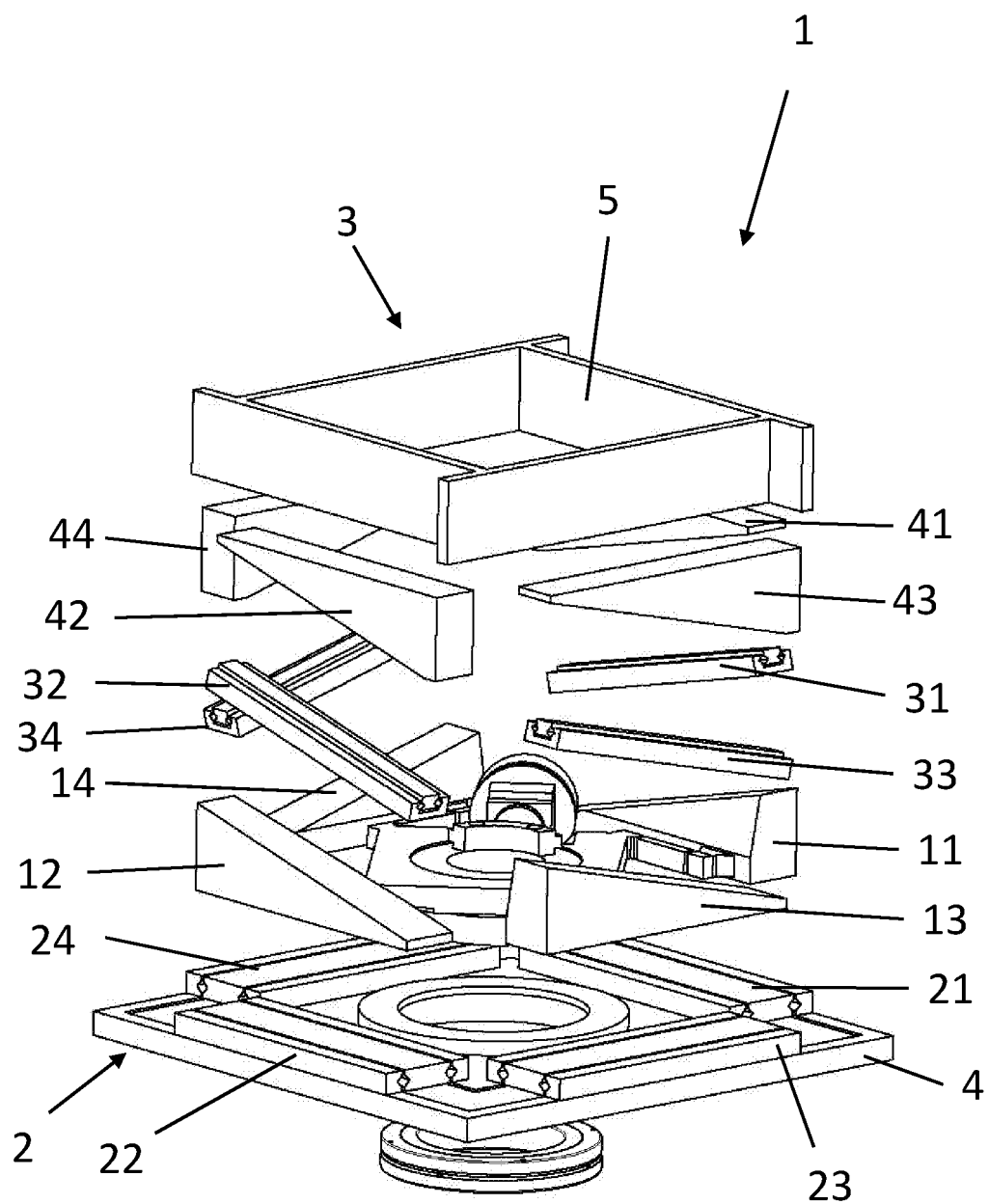
FIG. 2 shows an exploded view of the positioning device according to FIG. 1.

FIGS. 1 to 5 show a possible exemplary embodiment of a positioning device 1 according to the invention. The positioning device 1 comprises a flat base element 2 configured as a frame-like plate 4 with through opening as well as a carrier element 3 to be positioned relative to the base element 2 along a z-axis, which is also configured in the form of a square frame 5.

For displacement of the carrier element 3 along the z-axis, the positioning device 1 further comprises a first, a second, a third and a fourth slide element 11, 12, 13, 14. The four slide elements 11, 12, 13, 14 are in this case arranged displaceably in a common plane perpendicular to the z-axis and in a rectangular configuration distributed uniformly about the z-axis between the carrier element 3 and the base element 2.

Respectively a first, second, third or fourth base guide device 21, 22, 23, 24 and a first, second, third or fourth ascent guide device 31, 32 33, 34 are disposed on the first, second, third and fourth slide element 11, 12, 13, 14.

By means of the first or second base guide device 21, 22, the first or second slide element 11, 12 is displaceable relative to the base element 2 along a first or second base line 121, 122 which runs along an x-axis aligned perpendicular to the z-axis. Accordingly, the third or fourth slide element 13, 14 is disposed linearly displaceably on the base element 2 along a third or fourth base line 123, 124 which runs along a y-axis aligned perpendicularly to the x and y-axis by means of a third or fourth base guide device 23, 24.

The respective base guide devices 21, 22, 23, 24 are each disposed on a base side of the slide elements 11, 12, 13, 14 configured as wedge bodies. The respective ascent guide devices 31, 32, 33, 34 are disposed on the sloping side of the wedge-like slide elements 11, 12, 13, 14 opposite the respective base side, by means of which the slide elements 11, 12, 13, 14 are connected linearly displaceably to corresponding sloping surfaces of the carrier element 3 along a first, second, third or fourth ascent line 131, 132, 133, 134.

The sloping sides on the carrier element 3 on which respectively the first, second, third, or fourth ascent guide devices 31, 32, 33, 34 are disposed are each formed by a first, second, third or fourth wedge body 41, 42, 43, 44. These wedge bodies 41, 42, 43, 44 are arranged corresponding to the wedge-like slide elements 11, 12, 13, 14 in a rectangular configuration distributed uniformly about the z-axis on the outer sides of the frame-like carrier element 3. For better connection of the wedge bodies to the frame 5 of the carrier element 3, the four wall elements from which the frame 5 is constructed each project at one corner of the frame so that the wedge bodies 41, 42, 43, 44 each abut against two wall surfaces of the frame 5 arranged at right angles to one another. By this means the system stiffness of the positioning device 1 is sometimes additionally increased.

Figure 3:
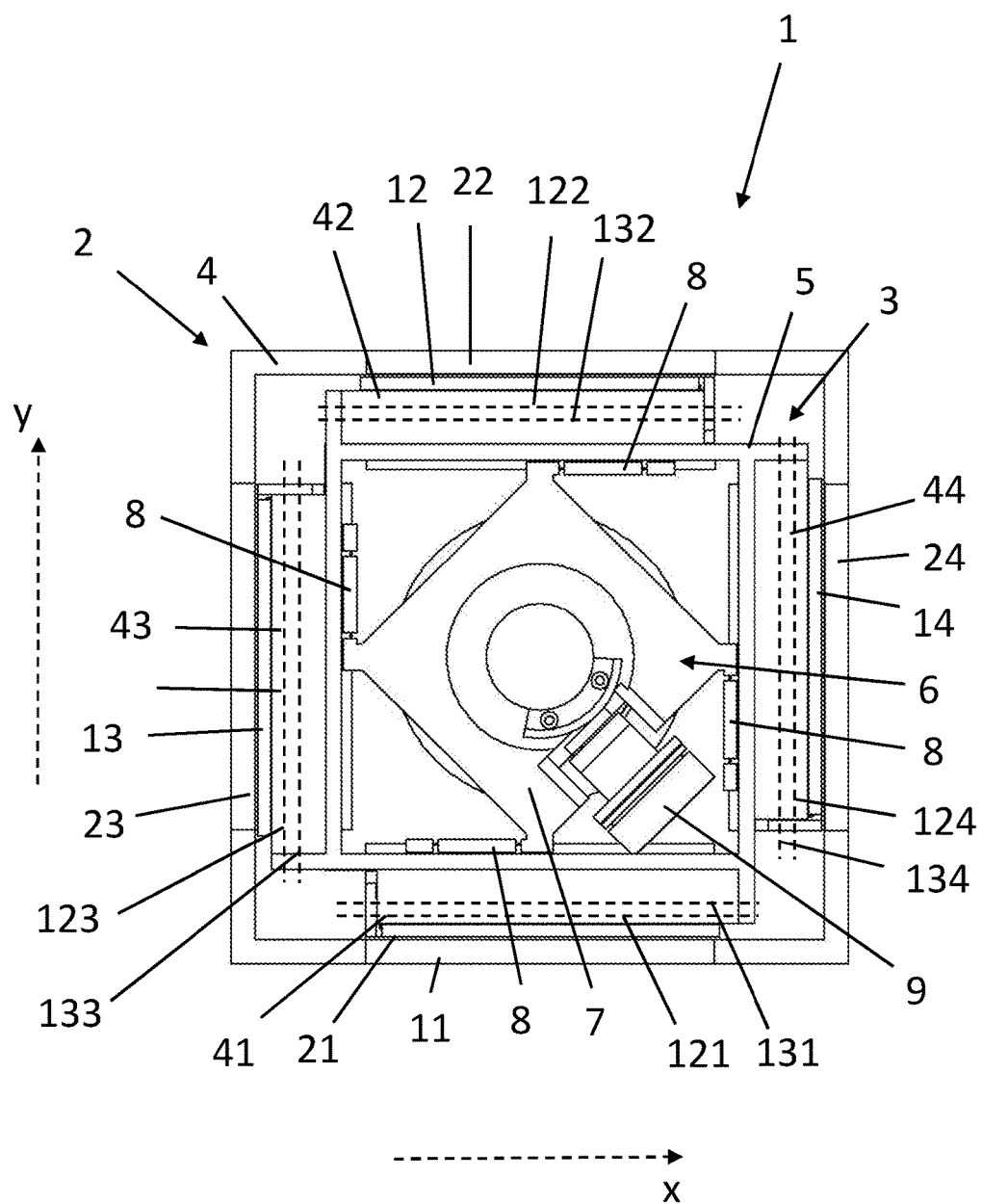
FIG. 3 shows a plan view of the positioning device according to FIG. 1.
Figure 4:
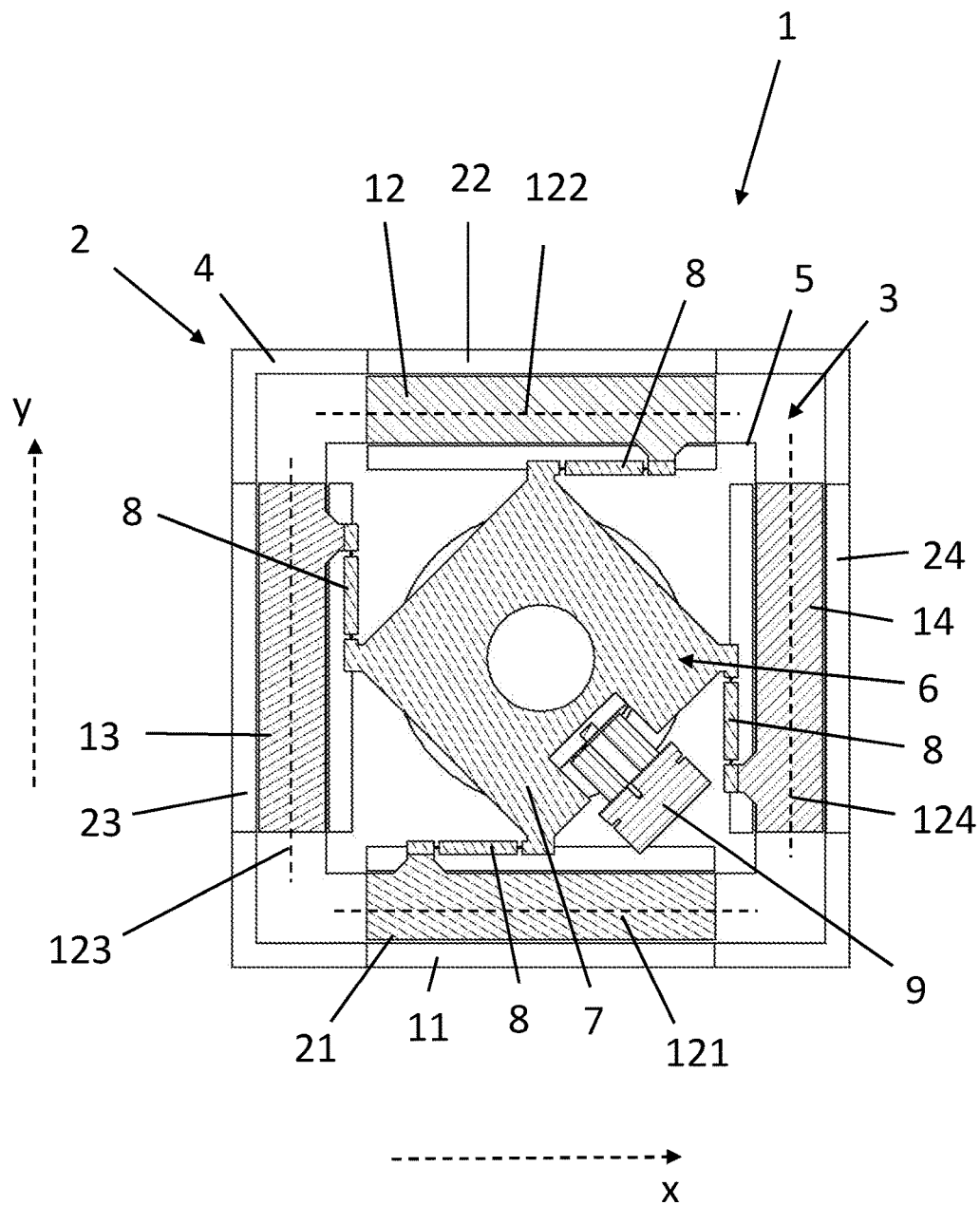
FIG. 4 shows a cross-section through the positioning device according to FIG. 1 along the z-axis.
Figure 5:
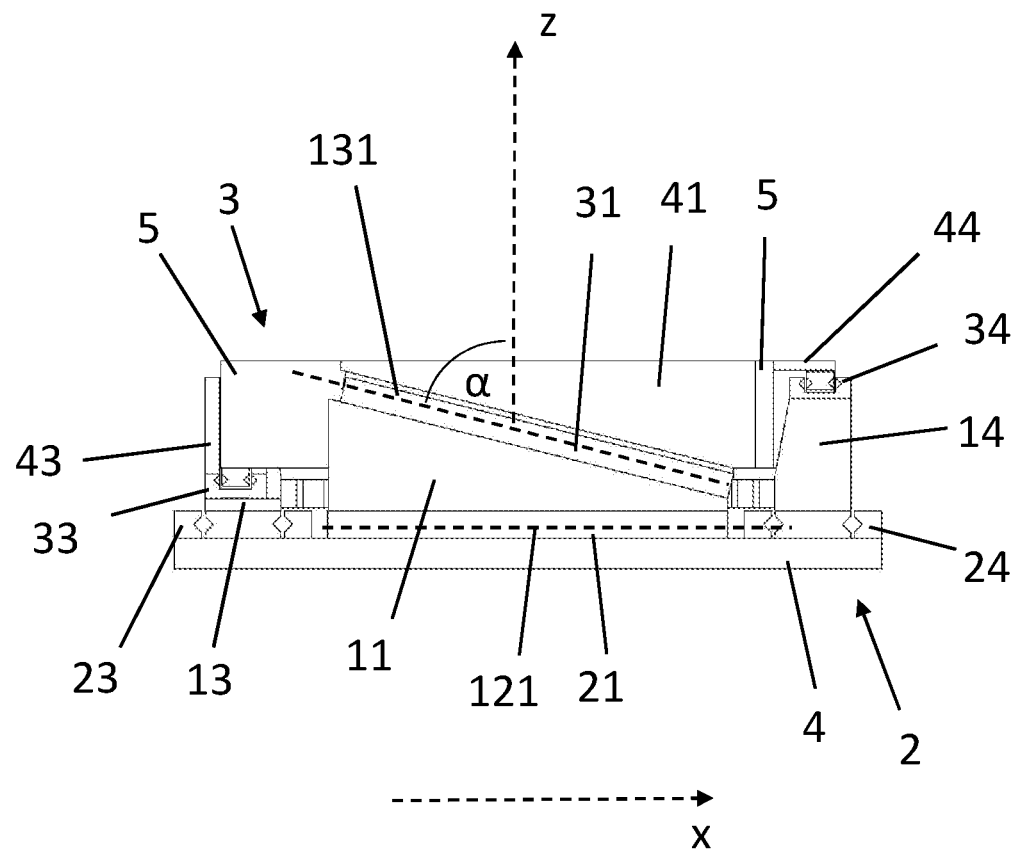
FIG. 5 shows a side view of the positioning device according to FIG. 1 along the y-axis.

As can be seen in particular in FIGS. 3 and 5, the ascent lines 131, 132, 133, 134 and the corresponding base lines 121, 122, 123, 124 are each arranged parallel, in particular congruently above one another in each case, in a projection along the z-axis. Each of the four ascent lines and each of the corresponding four base lines has a constant angle of inclination with respect to the z-axis, where the angle of inclination of the respectively corresponding ascent and base lines differ. In the present exemplary embodiment, the angle of inclination of the base lines relative to the z-axis is 90°. In comparison, the ascent lines or the sloping surfaces of each of the wedge-shaped slide elements 11, 12, 13, 14 enclose an angle of inclination a of about 76° with respect to the z-axis. Preferably the angle of inclination a should lie in the range between 71° and 79°.

In a projection along the y-axis, the sloping surfaces of the wedge-shaped first and second slide elements 11, 12 and accordingly the first and second ascent guide devices 31, 32 are oriented oppositely inclined with respect to one another in the manner according to the invention. Similarly, in a projection along the x-axis, the sloping surfaces of the wedge-shaped third and fourth slide elements 13, 14 and accordingly the third and fourth ascent guide devices 33, 34 are oriented oppositely inclined with respect to one another according to the invention. As a result, due to the opposite inclined arrangement of the slide elements and the ascent guide devices, it is achieved that a synchronous displacement of the first and the second slide element 11, 12 in opposite directions along the x-axis and of the third and fourth slide elements 13, 14 in opposite directions along the y-axis brings about a displacement of the carrier element 3 exclusively along the z-axis. This is because, as a result of their opposite inclination, the first and the second ascent guide device 31, 32 or the third and fourth ascent guide device 33, 34 each mutually block a transverse movement of the carrier element along the x or y-axis. An additional linear guide along the z-axis which would restrict the movement of the carrier element to the z-axis can therefore be dispensed with.

In the present exemplary embodiment, all the base guide devices 21, 22, 23, 24 and ascent guide devices 31, 32, 33, 34 are configured as linear guides with roller bearings. Naturally, other types and designs of linear guides are also feasible.

For the synchronous displacement of the four slide elements 11, 12, 13, 14, the positioning device 1 according to the present exemplary embodiment has a common drive device for all four slide elements 11, 12, 13, 14. The common drive device comprises a rotary drive 9 with an axis of rotation parallel to the z-axis and a coupling element 6, where the coupling element couples the rotary drive to the first, second, third and fourth slide element 11, 12, 13, 14 in such a manner that a rotational movement of the rotary drive 9 brings about a synchronous displacement of the first, second, third and fourth slide element 11, 12, 13, 14 along the respective base lines, i.e. along the x or y-axis. For this purpose, the coupling element 6 comprises a rotational body 7 connected rigidly to the axis of rotation and a total of four coupling members 8 which are rotatably mounted with respect to the axis of rotation with one end on each one of the slide elements 11, 12, 13, 14 and the other end radially spaced from the axis of rotation on the rotational body 7.

As a result of the same angle of inclination of the four ascent guide devices 31, 32, 33, 34 relative to the z-axis, the rotation of the drive device about the z-axis brings about a synchronous displacement of all four slide elements 11, 12, 13, 14 which in turn raise the carrier element 3 uniformly along the z-axis. The rectangular or square arrangement of the four slide elements is characterized in particular by a sufficiently high system stiffness for high-precision applications.

The present invention has been described in the context of one or more embodiments, and variations and examples thereof. It is to be understood, however, that other expedients known to those skilled in the art or disclosed herein may be employed without departing from the spirit of the invention.

Therefore, it is intended that the appended claims be interpreted as including the embodiment(s) described herein, any alternatives mentioned above, and all equivalents thereto.

What is claimed is:

1. A positioning device, comprising a base element, a carrier element to be positioned relative to the base element along a z-axis as well as at least one first and one second slide elements, wherein the first slide element is disposed displaceably by means of a first base guide device along a first base line on the base element and is disposed displaceably by means of a first ascent guide device along a first ascent line on the carrier element, wherein the second slide element is disposed displaceably by means of a second base guide device along a second base line on the base element and by means of a second ascent guide device along a second ascent line on the carrier element, wherein the first ascent line and the first base line run in a projection along the z-axis parallel to one another and are arranged relative to the z-axis so that each of the first ascent line and the first base line has a constant angle of inclination relative to the z-axis and the angles of inclination of the first ascent line and the first base line relative to the z-axis are different, wherein the second ascent line and the second base line run in a projection along the z-axis parallel to one another and are arranged relative to the z-axis so that each of second ascent line and the second base line has a constant angle of inclination relative to the z-axis and the angles of inclination of the second ascent line and the second base line relative to the z-axis are different, wherein the first and the second ascent guide devices are arranged with respect to one another in such a manner that in at least one projection perpendicular to the z-axis, the first and the second ascent lines are inclined opposite to one another relative to the z-axis so that a synchronous displacement of the first and the second slide elements relative to the base element causes a displacement of the carrier element relative to the base element exclusively along the z-axis, wherein for the synchronous displacement of the first and second slide elements the positioning device comprises at least one drive device which comprises a rotary drive having an axis of rotation parallel to the z-axis and a coupling element, wherein the coupling element couples the rotary drive to the first and second slide elements in such a manner that a rotational movement of the rotary drive causes a synchronous displacement of the first and second slide elements along the respective base lines.

2. The positioning device according to claim 1, which further comprises a third and a fourth slide elements, wherein the third slide element is disposed displaceably by means of a third base guide device along a third base line on the base element and is disposed displaceably by means of a third ascent guide device along a third ascent line on the carrier element, wherein the fourth slide element is disposed displaceably by means of a fourth base guide device along a fourth base line on the base element and by means of a fourth ascent guide device along a fourth ascent line on the carrier element, wherein the third ascent line and the third base line run parallel to one another in a projection along the z-axis and are arranged relative to the z-axis so that each one of the third ascent line and the third base line has a constant angle of inclination relative to the z-axis and the angles of inclination of the third ascent line and the third base line relative to the z-axis are different, wherein the fourth ascent line and the fourth base line run parallel to one another in a projection along the z-axis and are arranged relative to the z-axis so that each one of the fourth ascent line and the fourth base line has a constant angle of inclination relative to the z-axis and the angles of inclination of the fourth ascent line and the fourth base line relative to the z-axis are different, and wherein the third and fourth ascent guide devices are disposed with respect to one another in such a manner that in at least one projection perpendicular to the z-axis, the third and the fourth ascent lines are inclined opposite to one another relative to the z-axis so that a synchronous displacement of the first, second, third and fourth slide elements relative to the base element causes a displacement of the carrier element relative to the base element exclusively along the z-axis.

3. The positioning device according to claim 2, wherein the coupling element couples the rotary drive to the third and fourth slide elements in such a manner that a rotational movement of the rotary drive causes a synchronous displacement of the first, second, third and fourth slide elements along the respective base lines.

4. The positioning device according to claim 2, wherein the first, second, third and/or fourth base line run in a plane perpendicular to the z-axis.

5. The positioning device according to claim 2, wherein
   a. the first, second, third and fourth base lines are distributed uniformly about the z-axis;
   b. the first, second, third and fourth base lines are configured axis-symmetrically relative to the z-axis; and/or
   c. the first, second, third and fourth ascent lines are configured axis-symmetrically relative to the z-axis.

6. The positioning device according to claim 2, wherein the third and fourth base lines are straight lines.

7. The positioning device according to claim 6, wherein the third and fourth base lines run parallel to one another along a y-axis perpendicular to the x- and z-axis.

8. The positioning device according to claim 2, wherein
   a. the first, second, third and/or fourth base line comprises a ball bearing, crossed roller bearing, rolling bearing or dovetail guide; and/or
   b. the first, second, third and/or fourth ascent guide device comprises a ball bearing, crossed roller bearing, rolling bearing or dovetail guide.

9. The positioning device according to claim 2, wherein the first, second, third and/or fourth slide clement each comprises a wedge body.

10. The positioning device according to claim 2, wherein the carrier element comprises a first, second, third and/or fourth wedge body on which respectively the first, second, third or fourth ascent guide device is disposed.

11. The positioning device according to claim 2, wherein the first, second, third and fourth ascent lines each enclose an angle between 45° and 85° with respect to the z-axis.

12. The positioning device according to claim 2, wherein the first, second, third and fourth ascent lines each enclose an angle between 60° and 80° with respect to the z-axis.

13. The positioning device according to claim 2, wherein the first, second, third and fourth ascent lines each enclose an angle between 71° and 79° with respect to the z-axis.

14. The positioning device according to claim 2, wherein the first and the second ascent guide devices are disposed on opposite sides of the carrier element and/or that the third and the fourth ascent guide devices are disposed on opposite sides of the carrier element.

15. The positioning device according to claim 1, wherein the first and/or second base line run in a plane perpendicular to the z-axis.

16. The positioning device according to claim 1, wherein
 a. the first and second base lines are distributed uniformly about the z-axis;
 b. the first and second base lines are configured axis-symmetrically relative to the z-axis; and/or
 c. the first and second ascent lines are configured axis-symmetrically relative to the z-axis.

17. The positioning device according to claim 1, wherein the first and second base lines are straight lines.

18. The positioning device according to claim 17, wherein the first and second base lines run parallel to one another along an x-axis perpendicular to the z-axis.

19. The positioning device according to claim 1, wherein
 a. the first and/or second base line comprises a ball bearing, crossed roller bearing, rolling bearing or dovetail guide; and/or
 b. the first and/or second ascent guide device comprises a ball bearing, crossed roller bearing, rolling bearing or dovetail guide.

20. The positioning device according to claim 1, wherein the first and/or second slide element each comprises a wedge body.

21. The positioning device according to claim 1, wherein the carrier element comprises a first and/or second wedge body on which respectively the first or second ascent guide device is disposed.

22. The positioning device according to claim 1, wherein the first and second ascent lines each enclose an angle between 45° and 85° with respect to the z-axis.

23. The positioning device according to claim 1, wherein the base element comprises a plate.

24. The positioning device according to claim 23, wherein the plate is configured as frame-like plate with a through opening.

25. The positioning device according to claim 1, wherein the carrier element comprises a frame.

26. The positioning device according to claim 1, wherein the first and the second ascent guide device are disposed on opposite sides of the carrier element.

27. The positioning device according to claim 1, wherein the coupling element comprises a rotating body connected rigidly to the axis of rotation and at least one coupling member which is rotatably mounted relative to the axis of rotation with one end on one of the slide elements and the other end radially spaced apart from the axis of rotation on the rotating body.

28. The positioning device according to claim 1, wherein the first and second ascent lines each enclose an angle between 60° and 80° with respect to the z-axis.

29. The positioning device according to claim 1, wherein the first and second ascent lines each enclose an angle between 71° and 79° with respect to the z-axis.

30. The positioning device according to claim 25, wherein the frame is configured as rectangular frame.

31. The positioning device according to claim 30, wherein the frame is configured as square frame.

* * * * *